United States Patent
Kashiwagi et al.

(10) Patent No.: US 9,657,175 B2
(45) Date of Patent: May 23, 2017

(54) SILICONE RESIN COMPOSITION FOR SEALING OPTICAL SEMICONDUCTOR ELEMENT AND OPTICAL SEMICONDUCTOR DEVICE

(71) Applicant: Shin-Etsu Chemical Co., Ltd., Tokyo (JP)

(72) Inventors: Tsutomu Kashiwagi, Annaka (JP); Takayuki Kusunoki, Annaka (JP); Tomoyuki Mizunashi, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/886,674

(22) Filed: Oct. 19, 2015

(65) Prior Publication Data

US 2016/0108240 A1    Apr. 21, 2016

(30) Foreign Application Priority Data

Oct. 20, 2014  (JP) ................................. 2014-213706

(51) Int. Cl.
| | |
|---|---|
| C08L 83/04 | (2006.01) |
| H01L 33/56 | (2010.01) |
| C09D 183/04 | (2006.01) |
| C09D 183/14 | (2006.01) |
| C08G 77/12 | (2006.01) |
| C08G 77/20 | (2006.01) |

(52) U.S. Cl.
CPC ............ *C08L 83/04* (2013.01); *C09D 183/04* (2013.01); *C09D 183/14* (2013.01); *H01L 33/56* (2013.01); *C08G 77/12* (2013.01); *C08G 77/20* (2013.01)

(58) Field of Classification Search
CPC ....... C08G 77/12; C08G 77/20; C08G 77/045
See application file for complete search history.

(56) References Cited

U.S. PATENT DOCUMENTS

| | | | |
|---|---|---|---|
| 7,323,250 B2 | 1/2008 | Tabei et al. | |
| 8,258,502 B2 | 9/2012 | Yoshitake et al. | |
| 2010/0276721 A1* | 11/2010 | Yoshitake | ............ C08K 5/5425 257/99 |
| 2014/0377570 A1* | 12/2014 | Hirai | ...................... C08G 77/20 428/447 |

FOREIGN PATENT DOCUMENTS

| | | |
|---|---|---|
| JP | 2005-272697 A | 10/2005 |
| JP | 2009-527622 A | 7/2009 |
| WO | 2013 039265 | * 3/2013 |

OTHER PUBLICATIONS

Freeman (Silicones, published for the Plastics Institute, ILIFEE Books Ltd., 1962, p. 27).*

* cited by examiner

*Primary Examiner* — Kuo-Liang Peng
(74) *Attorney, Agent, or Firm* — Birch, Stewart, Kolasch & Birch, LLP

(57) ABSTRACT

A silicone resin composition for sealing an optical semiconductor element includes (A) (A-1) an organopolysiloxane having a resin structure which contains at least two alkenyl groups in one molecule, the alkenyl groups being present at 10 to 70 mol % of the total substituent groups bonded to silicon atoms, (B) an organopolysiloxane oligomer having at least two alkenyl groups in one molecule and 2 to 5 silicon atoms, (C) an organohydrogenpolysiloxane which contains at least one hydrosilyl group and may have an alkoxy group or hydroxyl group in one molecule, and (D) an addition reaction catalyst, and is capable of providing a transparent cured product.

15 Claims, 1 Drawing Sheet

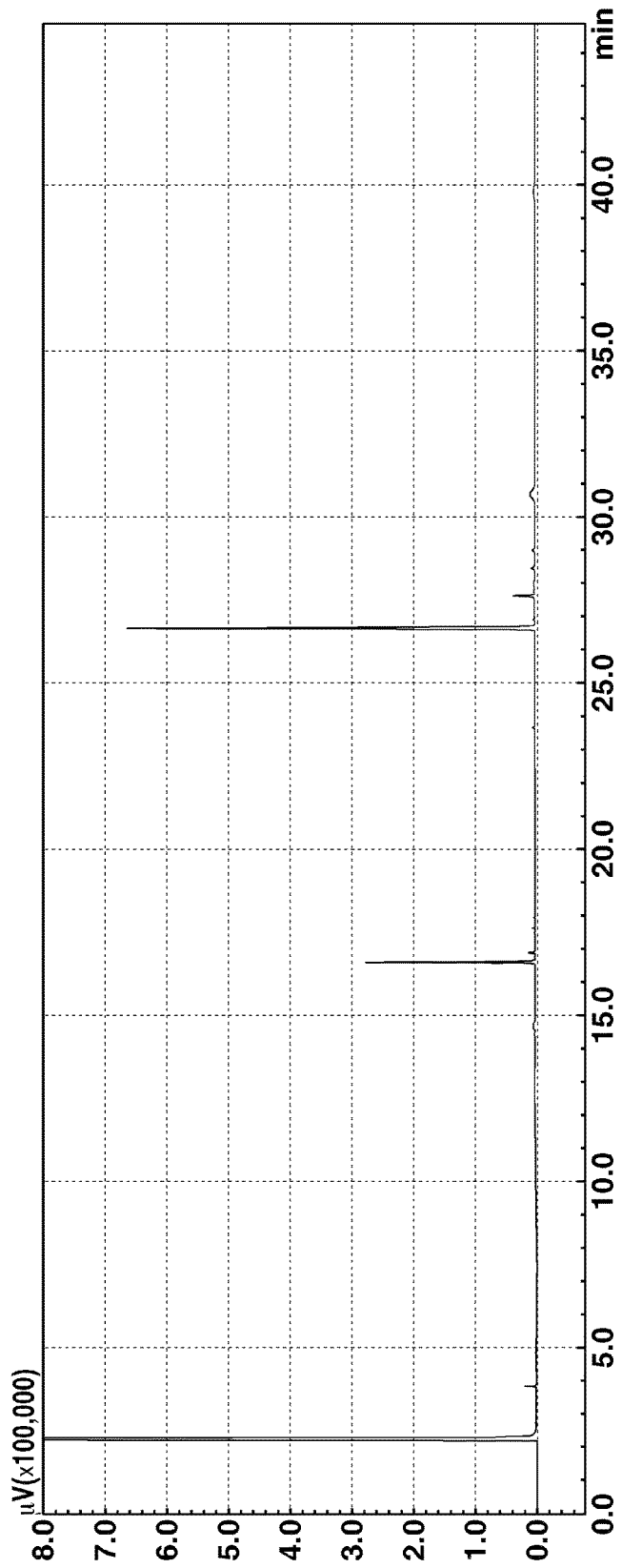

SILICONE RESIN COMPOSITION FOR SEALING OPTICAL SEMICONDUCTOR ELEMENT AND OPTICAL SEMICONDUCTOR DEVICE

CROSS-REFERENCE TO RELATED APPLICATION

This non-provisional application claims priority under 35 U.S.C. §119(a) on Patent Application No. 2014-213706 filed in Japan on Oct. 20, 2014, the entire contents of which are hereby incorporated by reference.

TECHNICAL FIELD

This present invention relates to a silicone resin composition for sealing an optical semiconductor element capable of yielding a transparent cured product useful as a sealing or encapsulating material for optical semiconductors and an optical semiconductor device wherein an optical semiconductor element is encapsulated with a cured product of the composition.

BACKGROUND ART

In recent years, high-luminance light-emitting diodes (LEDs), which exhibit high light intensity and are great in heat generation, have been commercialized and have been in wide use for general illumination. This entails a change from existing nylon-based reflectors to silicone or epoxy resin package materials, for which novel characteristics are required for inner resins. In JP-A 2005-272697 as Patent Document 1, it is stated that a phenolic antioxidant and a hindered amine light degradation inhibitor are added to phenol-based silicone resins thereby providing a sealing material that is excellent in heat resistance, light resistance and weatherability. However, this silicon resin composition is lowered in the effect of the light degradation inhibitor after its long use, with some concern that the resin undergoes discoloration due to the light degradation of the phenyl group and also suffers degradation owing to the breakage of siloxane bonds.

JP-T 2009-527622 as Patent Document 2 describes a silicone resin composition comprising a phenyl group-containing organopolysiloxane and a hydrogendiorganosiloxy-terminated oligodiphenylsiloxane as being useful for prolonging the life of LED. However, when such a silicone resin composition is employed for the package of high-luminance LEDs which are high in light intensity and great in heat generation, cracks are apt to occur at LED package ends or the base of a lead frame. Especially, because of poor adhesion to silver, peeling is liable to occur at the interface between the LED package and a silver frame.

CITATION LIST

Patent Document 1: JP-A 2005-272697
Patent Document 2: JP-T 2009-527622

DISCLOSURE OF THE INVENTION

It is an object of the present invention to provide a silicone resin composition for sealing an optical semiconductor element capable of yielding a transparent cured product that has such an elongation at break as to allow a reflector stress to be absorbed with an inner material and ensures strong adhesion to a substrate. Another object is to provide an optical semiconductor device having high reliability.

In order to achieve the above objects, we have made extensive studies and, as a result, found that a cured product of an addition curing silicone resin composition including a combination of a disiloxane containing at least two alkenyl group or an oligomer thereof with a resin having a high content of alkenyl groups, is great in elongation at break sufficient to absorb a stress of reflector with an inner material and has excellent adhesion to a substrate. Moreover, it has also been found that the silicone resin composition is excellent in light resistance and heat resistance, so that exposure to high-intensity light or high temperature conditions does not cause any crack or peeling and a cured product thereof is prevented from being discolored because of its low gas permeation rate.

Accordingly, the present invention provides a silicone resin composition for sealing an optical semiconductor element, and also an optical semiconductor device using a cured product thereof.

More particularly, in one aspect, the present invention provides a silicone resin composition for sealing an optical semiconductor element including:

(A) (A-1) 20 to 100 parts by weight of an organopolysiloxane having a resin structure which contains at least two alkenyl group in one molecule, the alkenyl groups being present at 10 to 70 mol % of total substituent groups bonded to silicon atoms, and (A-2) 0 to 80 parts by weight of a linear organopolysiloxane which has an alkenyl group only at both ends of a molecular chain and has a viscosity of 10 to 1,000,000 mPa·s at 25° C. when measured by means of a Brookfield rotary viscometer according to a method described in JIS K 7117-1 provided that a total content of the components (A-1) and (A-2) is 100 parts by weight;

(B) 3 to 20 parts by weight of an organosiloxane oligomer having at least two alkenyl groups in one molecule and 2 to 5 silicon atoms;

(C) an organohydrogenpolysiloxane which contains at least one hydrosilyl group and may further contain an alkoxy group or hydroxyl group in one molecule, in an amount corresponding to 0.5 to 4.0 equivalents as a total equivalent of the hydrosilyl groups in the component (C) per unit equivalent of total alkenyl groups in the components (A-1), (A-2) and (B); and (D) a catalytic amount of an addition reaction catalyst.

In the silicone resin composition as above, preferably, 0.1 to 3.0 parts by weight of (E) an acrylate group-containing compound per 100 parts by weight of a total of the components (A) to (C).

The component (A-1) is preferably an organopolysiloxane represented by the following average compositional formula (1):

$$R^1{}_aR^2{}_bR^3{}_cSiO_{(4-a-b-c)/2} \quad (1)$$

wherein $R^1$ independently represents an unsubstituted or substituted monovalent aliphatic saturated hydrocarbon group, $R^2$ independently represents a monovalent aromatic hydrocarbon group, $R^3$ independently represents an alkenyl group, and a is a positive number of 0.1 to 1.0, b is a positive number of 0 to 0.85 and c is a positive number of 0.05 to 0.5 provided that a+b+c is 1.0 to 1.8.

In the silicone resin composition as above, preferably, the alkenyl group in the component (A-1) is present at 10 to 25 mol % relative to the total substituents bonded to the silicon atoms.

The component (B) is preferably an organosiloxane oligomer represented by the following general formula (2):

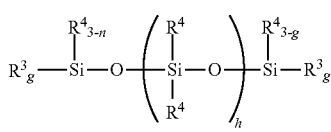

(2)

wherein $R^3$ independently represents an alkenyl group, $R^4$ independently represents an unsubstituted or substituted monovalent aliphatic saturated hydrocarbon group or a monovalent aromatic hydrocarbon group, g is independently an integer of 1 to 3, h is an integer of 0 to 3.

The component (C) is preferably a linear organohydrogenpolysiloxane represented by the following general formula (3):

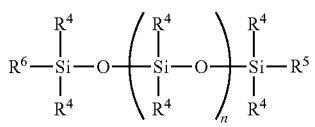

(3)

wherein $R^4$ independently represents an unsubstituted or substituted monovalent aliphatic saturated hydrocarbon group or a monovalent aromatic hydrocarbon group, $R^5$ independently represents a hydrogen atom, a hydroxyl group or an alkoxy group having 1 to 10 carbon atoms, $R^6$ is $R^4$ or $R^5$ wherein at least one atom in the molecule is a hydrogen atom, and n is an integer of 1 to 10.

In the silicone resin composition, the aromatic hydrocarbon group is preferably present at 10 to 60 mol % relative to total substituent groups of the components (A) to (C) bonded to the silicon atoms.

Preferably, the silicone resin composition further comprises as a tackifier 0.001 to 10 parts by weight of (F) a compound selected from alkoxysilanes, chlorosilanes and (partially) co-hydrolyzed condensates having a group selected from an epoxy group, a (meth)acryl group, an amino group and a mercapto group, alkoxysilanes having an alkenyl group or a hydrogen atom (hydrosilyl group), alkoxysilyl group-containing isocyanuric acids, cyclic siloxanes containing an SiH group, an alkoxysilyl group and/or an epoxy group (except for the component (C)), per 100 parts by weight of a total amount of the components (A) to (C).

In one aspect, the present invention provides an optical semiconductor device including an optical semiconductor element sealed with a cured product of the silicone resin composition as above.

Advantageous Effects of the Invention

The silicone resin composition of the present invention can provide a cured product having excellent adhesion to a substrate. When an optical semiconductor element such as a high-luminance LED is sealed with the silicone resin composition, there can be provided an optical semiconductor device that is high in heat resistance and light resistance and excellent in discoloration and impact resistances and is thus very reliable. Hence, the silicone resin composition is very useful as a sealing or encapsulating material for optical semiconductor devices.

BRIEF DESCRIPTION OF THE DRAWING

FIG. 1 is a gas chromatographic (GC) chart of an organohydrogenpolysiloxane prepared in Synthetic Example 3.

DESCRIPTION OF THE PREFERRED EMBODIMENTS

The silicone resin composition for sealing an optical semiconductor element capable of imparting a transparent cured product according to the present invention includes:

(A) (A-1) 20 to 100 parts by weight of an organopolysiloxane having a resin structure which contains at least two alkenyl group in one molecule, the alkenyl groups being present at 10 to 70 mol % of total substituent groups bonded to silicon atoms, and (A-2) 0 to 80 parts by weight of a linear organopolysiloxane which has an alkenyl group only at both ends of a molecular chain and has a viscosity of 10 to 1,000,000 mPa·s at 25° C. when measured by means of a Brookfield rotary viscometer according to a method described in JIS K 7117-1 provided that a total content of the components (A-1) and (A-2) is 100 parts by weight;

(B) 3 to 20 parts by weight of an organosiloxane oligomer having at least two alkenyl groups in one molecule and 2 to 5 silicon atoms;

(C) an organohydrogenpolysiloxane which contains at least one hydrosilyl group and may further contain an alkoxy group or hydroxyl group in one molecule, in an amount corresponding to 0.5 to 4.0 equivalents as a total equivalent of the hydroxysilyl groups in the component (C) per unit equivalent of total alkenyl groups in the components (A-1), (A-2) and (B); and (D) a catalytic amount of an addition reaction catalyst.

(A-1) Organopolysiloxane Having Resin Structure

The component (A-1) is an organopolysiloxane having a resin structure which contains at least two alkenyl groups in one molecule. The organopolysiloxane is preferably represented by the following average compositional formula (1):

(1)

wherein $R^1$ independently represents an unsubstituted or substituted monovalent aliphatic saturated hydrocarbon group, $R^2$ independently represents a monovalent aromatic hydrocarbon group, $R^1$ independently represents an alkenyl group, and letter a is a positive number of 0.1 to 1.0, letter b is a positive number of 0 to 0.85 and letter c is a positive number of 0.05 to 0.5 provided that a+b+c is 1.0 to 1.8.

In the above formula (1), $R^1$ represents an unsubstituted or substituted monovalent aliphatic saturated hydrocarbon group having preferably 1 to 10 carbon atoms, more preferably 1 to 6 carbon atoms. Examples of $R^1$ include alkyl groups such as methyl group, ethyl group, propyl group, isopropyl group, butyl group, isobutyl group, tert-butyl group, pentyl group, neopentyl group, hexyl group, octyl group, nonyl group, or decyl group, and those groups indicated above wherein one or more of the hydrogen atoms of the groups are replaced by a halogen atom such as fluorine, bromine, and chlorine or a cyano group, e.g. halogen-substituted alkyl groups such as a chloromethyl group, a chloropropyl group, a bromoethyl group, or a trifluoropropyl group, and a cyano group-substituted alkyl group such as a cyanoethyl group.

In the above formula (1), $R^2$ is a monovalent aromatic hydrocarbon group. Examples of $R^2$ include an aryl group having 6 to 10 carbon atoms and an aralkyl group having 7 to 11 carbon atoms. Examples of the aryl group include phenyl group, tolyl group, xylyl group, or naphthyl group. Examples of the aralkyl group include benzyl group, phenylethyl group, or phenylpropyl group. Of these, phenyl group, tolyl group, benzyl group and phenylethyl group are preferred, of which a phenyl group is more preferred.

In the formula (1), $R^3$ is an alkenyl group having preferably 2 to 8 carbon atoms, more preferably 2 to 6 carbon atoms. Examples of $R^3$ include vinyl group, allyl group, propenyl group, isopropenyl group, butenyl group, hexenyl group, cyclohexenyl group, or octenyl group, of which vinyl group and allyl group are preferred. It will be noted that the content of $R^3$ relative to the total substituent groups in the formula (1) (i.e. a total of $R^1$ to $R^3$) is 10 to 70 mol %, preferably 10 to 30 mol %, more preferably 10 to 25 mol %. If less than 10 mol %, the resulting organopolysiloxane may become soft thereby lowering strength. Over 70 mol %, it may become brittle and may be apt to be broken.

In the formula (1), letter a is a positive number of 0.1 to 1.0, preferably 0.1 to 0.6, letter b is a positive number of 0 to 0.85, preferably, 0.1 to 0.8, letter c is a positive number of 0.05 to 0.5, preferably 0.1 to 0.4 provided that a+b+c is 1.0 to 1.8, preferably 1.1 to 1.7 and more preferably 1.2 to 1.6.

The organopolysiloxane having a resin structure (i.e. a three-dimensional network structure) serving as the component (A-1) is preferably one mainly composed of $R^4SiO_{3/2}$ units, $R^3_kR^4_pSiO_{2/2}$ units and $R^3_qR^4_rSiO_{1/2}$ units wherein $R^3$ independently has the same meaning as defined above, $R^4$ independently represents a group chosen from $R^1$ and $R^2$, preferably methyl or phenyl group, k is 0 or 1, p is 1 or 2 provided that k+p is 2, q is an integer of 0 to 3, preferably an integer of 1 to 3 and r is an integer of 0 to 3, preferably an integer of 0 to 2 provided that q+r is 3.

When the $R^4SiO_{3/2}$ units, $R^3_kR^4_pSiO_{2/2}$ units and $R^3_qR^4_rSiO_{1/2}$ units are, respectively, taken as A units, B units and C units, the organopolysiloxane of the resin structure is preferably constituted of the respective units in such molar ratios that B/A=5/5 to 1/9, preferably 3/7 to 1/9, C/A=0.05 to 3, preferably 0.1 to 0.5, (B+C)/A=0.01 to 1, preferably 0.1 to 0.5. It is to be noted that among these siloxane units, the B units may be contained or not.

The organopolysiloxane preferably has a weight average molecular weight, calculated as polystyrene, within a range of 500 to 10,000, more preferably 1,000 to 8,000, when measured according to gel permeation chromatography (GPC).

It will be noted that the weight average molecular weight used herein means a weight average molecular weight calculated as polystyrene when measured according to GPC under the following conditions.

[Measuring Conditions]
Developing solvent: tetrahydrofuran (THF)
Flow rate: 0.6 mL/minute
Detector: differential refractive index detector (RI)
Column: TSK Guardcolomn Super H-L
TSKgel SuperH4000 (6.0 mm I.D.×15 cm×1)
TSKgel SuperH3000 (6.0 mm I.D.×15 cm×1)
TSKgel SuperH2000 (6.0 mm I.D.×15 cm×2) all, made by Tosoh Corporation
Column temperature: 40° C.
Sample injection amount:
20 μL (THF solution having a concentration of 0.5 weight %)

Aside from the A, B and C units, the resin-structured organopolysiloxane may further contain bifunctional siloxane units or trifunctional siloxane units in small amounts within ranges not impeding the purpose of the present invention. It will be noted that "small amount" used herein means an amount of 0 to about 10 mol % of the total siloxane units of the organopolysiloxane.

The resin-structured organopolysiloxane can be readily prepared by providing compounds serving as unit sources for the A, B and C units at such molar ratios as indicated above and subjecting co-hydrolysis/condensation reaction, for example, in the presence of an acid catalyst. Examples of the acid catalyst include inorganic acids such as hydrochloric acid or sulfuric acid, and organic acids such as acetic acid, citric acid, p-toluenesulfonic acid, methanesulfonic acid, or trifluoromethanesulfonic acid.

For the A unit source, there can be used, for example, phenyltrichlorosilane, phenyltrimethoxysilane, phenyltriethoxysilane, cyclohexyltrichlorosilane, cyclohexyltrimethoxysilane, cyclohexyltriethoxysilane, cyclopentyltrichlorosilane, n-propyltrichlorosilane, methyltrichlorosilane, methyltrimethoxysilane, or methyltriethoxysilane.

For the B unit source, there can be used, for example, methoxysilanes such as dimethyldimethoxysilane, diphenyldimethoxysilane, phenylmethyldimethoxysilane, cyclohexylmethyldimethoxysilane, dicyclohexyldimethoxysilane, cyclopentylmethyldimethoxysilane, dicyclopentyldimethoxysilane, methylvinyldimethoxysilane, phenylvinyldimethoxysilane, or cyclohexylvinyldimethoxysilane. There also can be used ethoxysilanes such as dimethyldiethoxysilane, phenylmethyldiethoxysilane, cyclohexylmethyldiethoxysilane, dicyclohexyldiethoxysilane, cyclopentylmethyldiethoxysilane, dicyclopentyldiethoxysilane, methylvinyldiethoxysilane, phenylvinyldiethoxysilane, or cyclohexylvinyldiethoxysilane. There also can be used chlorosilanes such as dimethyldichlorosilane, diphenyldichlorosilane, phenylmethyldichlorosilane, cyclohexylmethyldichlorosilane, dicyclohexyldichlorosilane, cyclopentylmethyldichlorosilane, dicyclopentyldichlorosilane, methylvinyldichlorosilane, phenylvinyldichlorosilane, or cyclohexylvinyldichlorosilane, and phenylmethyldichlorosilane.

For the C unit source, those indicated below can be used, for example.

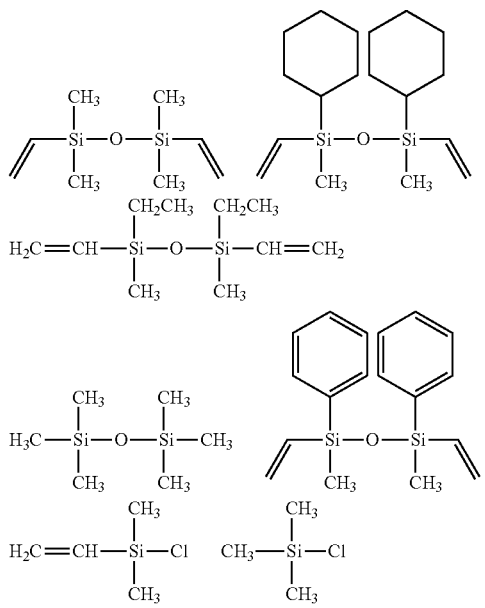

-continued

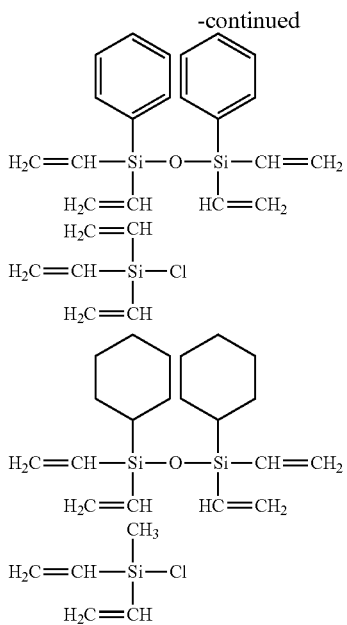

(A-2) Linear Organopolysiloxane

For the organopolysiloxane of the component (A-2) having an alkenyl group, there can be exemplified an organopolysiloxane having a linear structure wherein its main chain is composed of repetitions of organodisiloxane unit ($R^4_2SiO_{2/2}$ unit) and the both ends of the molecular chain are blocked with a triorganosiloxy group represented by $R^3_g R^4_{3-g}SiO_{1/2}$ units wherein $R^3$ and $R^4$ respectively have the same meanings as defined before, and g is an integer of 1 to 3. Thus, the organopolysiloxane has an alkenyl group only at both ends thereof. In the present invention, this organopolysiloxane is preferably used in combination with the component (A-1). It will be noted that the component (A-2) should preferably be free of an epoxy group and an alkoxy group.

The viscosity at 25° C. of the organopolysiloxane component (A-2) is 10 to 1,000,000 mPa·s, preferably 100 to 50,000 mPa·s from the standpoint of workability and curability. It will be noted that the viscosity is measured by means of a Brookfield rotary viscometer according to the method described in JIS K 7117-1 in the present invention.

Specific examples of the organopolysiloxane of the component (A-2) are those indicated below.

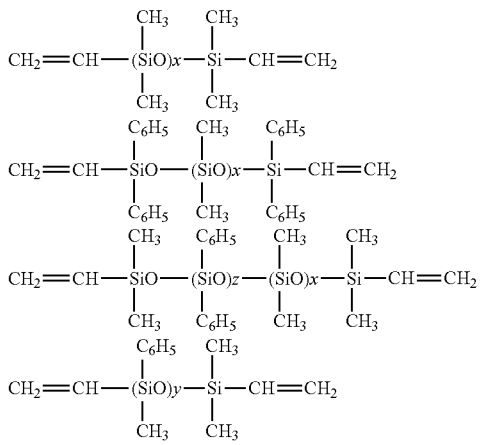

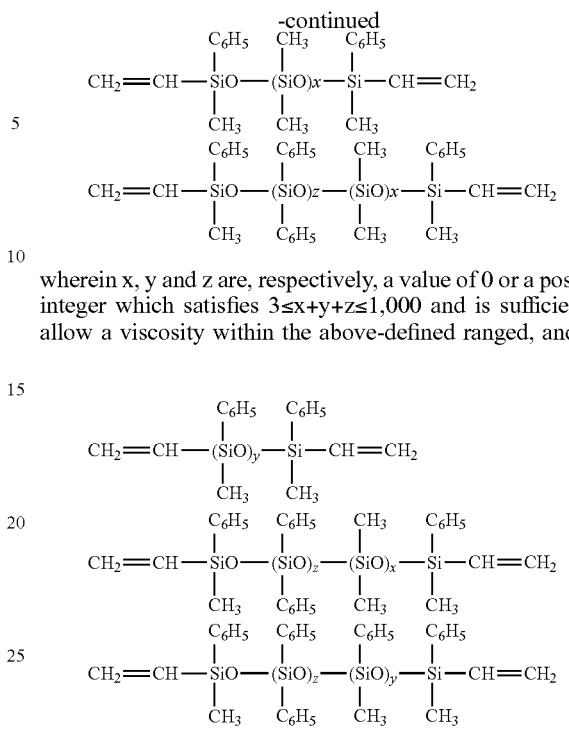

wherein x, y and z are, respectively, a value of 0 or a positive integer which satisfies $3 \leq x+y+z \leq 1,000$ and is sufficient to allow a viscosity within the above-defined ranged, and

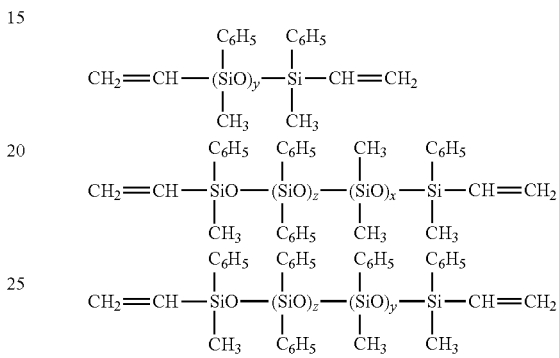

wherein x, y and z, respectively, have the same meanings as above and are those values sufficient to allow a viscosity within the above-defined range.

The resin-structured organopolysiloxane (A-1) is formulated so as to improve physical strength of a cured product and surface tackiness, and the organopolysiloxane having a linear structure is formulated so as to impart flexibility. The component (A-1) is preferably formulated at 20 to 100 weight %, more preferably at 40 to 90 weight %, relative to the total amount of the components (A-1) and (A-2). If the resin structured organopolysiloxane is too small in amount, the above effect may not be achieved satisfactorily in some cases. Too great an amount results in a significantly high viscosity of the resulting composition, with some possibility that cracks are liable to occur in the resulting cured product.

(B) Organosiloxane Oligomer Containing at Least Two Alkenyl Groups in One Molecule and 2 to 5 Silicon Atoms An organodisiloxane or organopolysiloxane serving as the component (B) containing at least two alkenyl groups in one molecule and having 2 to 5 silicon atoms acts not only as a low elasticization agent, but also as a reactive diluent of the resin-structured organopolysiloxane of the component (A-1), and has an effect of lowering the viscosity of the composition of the present invention.

For the component (B), there can be exemplified an organosiloxane oligomer represented by the following general formula (2):

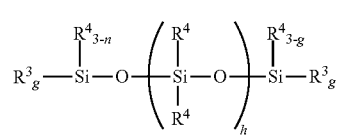

wherein $R^3$, $R^4$ and g, respectively, have the same meanings as defined above, and h is an integer of 0 to 3, preferably 0 or 1. It will be noted that the component (B) is preferably free of an epoxy group and an alkoxy group.

Examples of the component (B) include 1,2-divinyltetramethyldisiloxane, 1,2-divinyl-1,2-diphenyldimethyldisiloxane, hexavinyldisiloxane, 1,3-divinylhexamethyltrisiloxane, 1,3-divinyl-1,3-dimethyltetraphenyltrisiloxane, 1,1,3,3-tetravinyltetramethyltrisiloxane, 1,3-divinyl-1,3-diphenyltetramethyltrisiloxane, 1,3-divinyl-1,3-dimethyltetraphenyltrisiloxane, or 1,4-divinyloctamethyltetrasiloxane.

Of these, 1,2-divinyl-1,2-diphenyldimethyldisiloxane and 1,3-divinyl-1,3-dimethyltetraphenyltrisiloxane are preferred. The oligomers having 2 or 3 silicon atoms and at least two phenyl groups in the molecule can be favorably used because of their high dilution effect and capability of suppressing the component (B) from being volatilized.

The formulated amount of the component (B) is preferably at 3 to 20 parts by weight, more preferably at 5 to 15 parts by weight, relative to 100 parts by weight of the components (A-1) and (A-2) in total. If the component (B) is lesser, there may be some cases where its dilution effect is not obtained and thus, the viscosity is not lowered sufficiently. A larger amount may lead to cases where a coefficient of elasticity becomes too low, thereby lowering strength.

(C) Organohydrogenpolysiloxane Containing at Least One Hydrosilyl Group in One Molecule with or without Containing an Alkoxy Group or a Hydroxyl Group The organohydrogenpolysiloxane serving as the component (C) forms a crosslinked structure through hydrosilylation reaction between the hydrosilyl group in the molecule and the alkenyl group in the components (A-1), (A-2) and (B). This organohydrogenpolysiloxane may be in the form of a linear, branched, cyclic or network structure, which contains at least one, preferably from 2 to 10 hydrosilyl groups in one molecule and may further contain an alkoxy group or a hydroxyl group. The component (C) should not include a component (F) described hereinafter.

The number of silicon atoms (or a degree of polymerization) of the organohydrogenpolysiloxane is preferably at 2 to 100, more preferably at 3 to 10. Organohydrogenpolysiloxanes having the respective structures may be used singly or in admixture of two or more.

For the linear organohydrogenpolysiloxane, those represented by the following general formula (3) can be exemplified

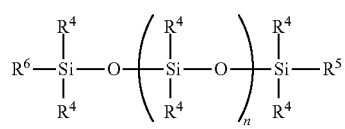 (3)

wherein $R^4$ independently has the same meaning as defined before, $R^5$ independently represents hydrogen atom, hydroxyl group, or an alkoxy group having 1 to 10 carbon atoms such as methoxy group, ethoxy group, or propoxy group, $R^6$ is $R^4$ or $R^5$ wherein at least one element in the molecule is hydrogen atom, and n is an integer of 0 to 10, preferably 1 to 4.

It will be noted that polysiloxanes having a hydrosilyl group at one end and polysiloxanes having a hydrosilyl group at both ends may be used singly or in combination, respectively. Nevertheless, if the component (C) is constituted of a linear organohydrogenpolysiloxane alone, it is preferred that a polysiloxane having a hydrosilyl group at both ends is contained at 50 to 100 weight %, preferably 60 to 95 weight %.

In view of preventing surface tackiness of a cured product, it is preferred that the linear organohydrogenpolysiloxane of the formula (3) has a silanol group or an alkoxysilyl group in an amount of 0.1 to 9 weight %, preferably 0.5 to 7 weight % of all the organic groups bonded to the silicon atoms. When the amount of the silanol group or alkoxysilyl group exceeds the upper limit defined above, these hydrolyzable groups left in the cured product may not act well as a crosslinking agent for assisting cleavage of the siloxane bond under intense heat or light conditions or under conditions where rich moisture is present. Additionally, cracks may be apt to occur, or peeling-off may be liable to occur at the interface, between the package and a silver frame, with concern that the resulting optical semiconductor device may be lowered in reliability.

For the branched or network organohydrogenpolysiloxane, there can be exemplified those represented by the following average composition formula (4):

 (4)

wherein $R^1$ and $R^2$ have independently the same meanings as defined before, d is a positive number of 0.2 to 1.5, preferably 0.4 to 1.2, e is a positive number of 0 to 0.5, preferably 0.1 to 0.4 and f is a positive number of 0.1 to 0.8, preferably 0.2 to 0.8 provided that d+e+f is 1.0 to 1.8, preferably 1.0 to 1.6, and the position of the hydrosilyl group is not specifically limited to in the molecule and may be at a end or in the middle of the molecular chain.

As such an organohydrogenpolysiloxane of the component (B), mention is made of tris(dimethylhydrogensiloxy)methylsilane, 1,1,3,3-tetramethyldisiloxane, 1,1,1,3,3-pentamethyldisiloxane, 1,3,5,7-tetramethylcyclotetrasiloxane, dimethylpolysiloxane blocked with a dimethylhydrogensiloxy group at both ends, dimethylpolysiloxane blocked with a dimethylhydrogen siloxy group at one end and a trimethylsiloxy group at the other end, a copolymer made of $(CH_3)_2HSiO_{1/2}$ units and $SiO_{4/2}$ units, or a copolymer made of $(CH_3)_2HSiO_2$ units, $SiO_{4/2}$ units, and $(C_6H_5)SiO_{3/2}$ units.

Further, organohydrogenpolysiloxanes represented by the following structures may also be used.

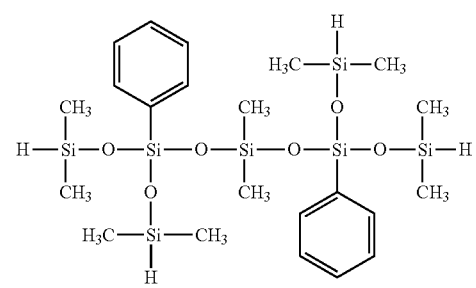

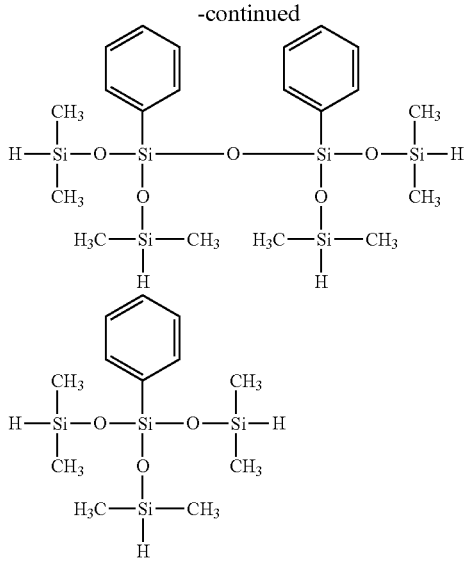

The organohydrogenpolysiloxane of the component (C) can be prepared by known methods, e.g. by hydrolysis and condensation of chlorosilanes represented by any one or more of $R^4SiHCl_2$, $R^4{}_3SiCl$, $R^4{}_2SiCl_2$ and $R^4{}_2SiHCl$ wherein $R^4$ is a group selected from $R^1$ and $R^2$ defined above, or by equilibration of the siloxane obtained by hydrolysis and condensation by use of a strong acid catalyst such as sulfuric acid, hydrochloric acid, methanesulfonic acid, or trifluoromethanesulfonic acid.

The formulated amount of the component (C) is an effective amount sufficient to cure the components (A-1), (A-2) and (B) in a total amount. More particularly, the total content of the hydrosilyl groups in the component (C) is preferably at 0.5 to 4.0 equivalents, more preferably at 0.8 to 2.0 equivalents and most preferably at 0.9 to 1.5 equivalents, per unit equivalent of a total alkenyl group of the components (A-1), (A-2) and (B). If less than the lower limit, there may be some cases where the addition reaction does not proceed, thus making it difficult to obtain a cured product. Over the upper limit, because an unreacted hydrosilyl group is left in a cured product in large amounts, there may be some concern that rubber's physical properties change with time.

The silicone resin composition of the present invention should preferably contain 10 to 60 mol %, more preferably 15 to 60 mol % of an aromatic hydrocarbon group relative to all substituent groups bonded to the silicon atoms in the components (A) to (C). The aromatic hydrocarbon group includes an aryl group having 6 to 10 carbon atoms or an aralkyl group having 7 to 11 carbon atoms. Examples of the aryl group include phenyl group, tolyl group, xylyl group, or naphthyl group, and examples of the aralkyl group include benzyl group, phenylethyl group, or phenylpropyl group. Of these, phenyl group, tolyl group, benzyl group and phenylethyl group are preferred, of which phenyl group is most preferred. If the content of the aromatic hydrocarbon group is less than 10 mol %, the gas permeability of the resulting cured product may increase with some cases where a silver surface in an LED package is corroded thereby lowering the luminance of LED. Over the upper limit, reliability may be damaged.

(D) Addition Reaction Catalyst

The addition reaction catalyst (D) is formulated to promote the addition reaction of the components (A) to (C). Although usable addition reaction catalysts include platinum, palladium and rhodium-based catalysts, of which platinum metal catalysts are preferred in view of their costs. Examples of the platinum metal catalyst include $H_2PtCl.mH_2O$, $K_2PtCl_6$, $KHPtCl_6.mH_2O$, $K_2PtCl_4$, $K_2PtCl_4.mH_2O$ and $PtO_2.mH_2O$ wherein m is a positive integer. Alternatively, complexes of platinum metal catalysts and hydrocarbons such as olefins, alcohols or vinyl group-containing organopolysiloxanes may also be used. These catalysts may be used singly or in combination of two or more.

The addition reaction catalyst may be formulated in a so-called catalytic amount. Where a platinum metal catalyst is used, its amount, calculated as a platinum metal, is preferably at 0.0001 to 0.2 parts by weight, more preferably at 0.0001 to 0.05 parts by weight relative to 100 parts by weight of the components (A) to (C) in total.

(E) Acrylate Group-Containing Compound

The silicone resin composition of the present invention may be further formulated, aside from the components (A) to (D), with (E) an acrylate group-containing compound. The formulation of the acrylate group-containing compound leads to improved affinity for organic resins and also to improved adhesiveness. The acrylate group-containing compound may be either monofunctional or polyfunctional with respect to the acrylate group, of which a bifunctional acrylate compound is preferred because of its reduced influence on physical properties of a cured product and a great effect of improving adhesiveness.

Examples of the bifunctional acrylate group-containing compound include 1,4-butanediol diacrylate, 1,6-hexanediol diacrylate, 1,9-nonanediol diacrylate, tricylcodecene dimethanol acrylate, polyethylene glycol-modified neopentyl glycol diacrylate, tricyclodecane dimethanol diacrylate, bisphenol A (poly)ethoxydiacrylate, bisphenol A (poly)propoxydiacrylate, bisphenol F (poly)ethoxydiacrylate, ethylene glycol di(meth)acrylate, dioxane glycol diacrylate (e.g. KAYARAD R-604, made by Nippon Kayaku Co., Ltd.), dicyclopentanyl dimethylene diacrylate (e.g. KAYARAD R-684, made by Nippon Kayaku Co., Ltd.), a diacrylate of an ε-caprolactone adduct of neopentyl glycol (poly)ethylene glycol diacrylate hydroxypivalate (e.g. KAYARAD HX-220 or HX-620 made by Nippon Kayaku Co., Ltd.)

When used, the component (E) is preferably added in an amount of 0.1 to 3.0 parts by weight, more preferably 0.2 to 2.0 parts by weight, relative to 100 parts by weight of the components (A) to (C) in total. If the amount is larger than the lower limit, adhesiveness is favorably imparted. When the amount is less than the upper limit, no influence is favorably given on physical properties of a cured product.

(F) Tackifier

Aside from the components (A) to (E), the silicone resin composition of the present invention may be further formulated with a tackifier (F). The tackifier (F) contains a hydrolyzable silyl group and a functional group having affinity for and/or reactivity with an adherend in the molecule thereby enabling the adhesiveness to be imparted to the composition of the present invention.

As a hydrolyzable silyl group, mention can be made of a trialkoxysilyl group such as trimethoxysilyl group, triethoxysilyl group, tripropoxysilyl group, or triisopropenoxysilyl group, and a dialkoxyalkylsilyl group such as dimethoxymethylsilyl group, dimethoxyethylsilyl group, dimethoxyphenylsilyl group, diethoxymethylsilyl group, diethoxyethylsilyl group, or diethoxyphenylsilyl group.

The functional group having affinity for and/or reactivity with an adherend includes, for example, an epoxy group, an acryl group, a methacryl group, an amino group, an N-alkylamino group, an N-arylamino group, a mercapto group, an alkenyl group, or a hydrogen atom (hydrosilyl group).

For the tackifier of the component (F), mention is made of an alkoxysilane, chlorosilane or a (partially) co-hydrolyzed condensate thereof having a group selected from an epoxy group, a (meth)acryl group, an amino group and a mercapto group; an alkoxysilane having an alkenyl group or a hydrogen atom (hydrosilyl group); an alkoxysilyl group-containing isocyanuric acid; and a cyclic siloxane having an SiH group, an alkoxysilyl group and/or an epoxy group (provided that the component (C) is excluded).

Specific examples of the component (F) include 2-(3,4-epoxycylohexyl)ethyltrimethoxysilane, 3-glycidoxypropyltrimethoxysilane, 3-glycidoxypropylmethyldiethoxysilane, 3-glycidoxypropyltriethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, N-2(aminoethyl)3-aminopropylmethyldimethoxysilane, N-2(aminoethyl)3-aminopropyltrimethoxysilane, N-2(aminoethyl)3-aminopropyltriethoxysilane, 3-aminopropyltrimethoxysilane, 3-aminopropyltriethoxysilane, N-phenyl-3-aminopropyltrimethoxysilane, 3-mercaptopropyltrimethoxysilane, tetramethoxysilane, phenyltrimethoxysilane, diphenyldimethoxysilane, and (partially) co-hydrolyzed condensates of these alkoxysilanes and/or corresponding chlorosilanes, vinyltrimethoxysilane, vinyltriethoxysilane, or trimethoxysilane.

Additionally, specific examples of the component (F) include cyclic polysiloxanes having an isocyanuric ring or a hydrosilyl group and modified with a hydrolyzable silyl group and a functional group having affinity for and/or reactivity with an adherend as represented by the following formulas.

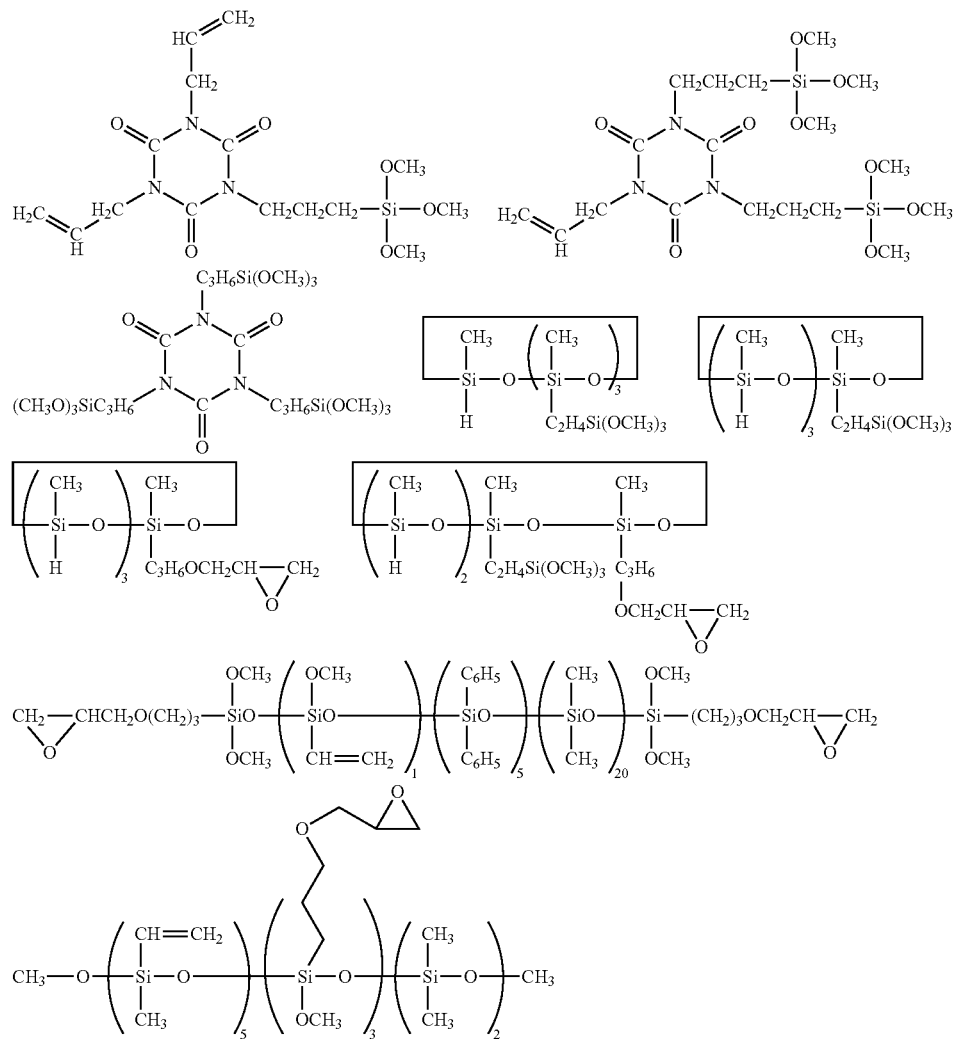

Of these, one represented by the following formula is preferred for use as a tackifier.

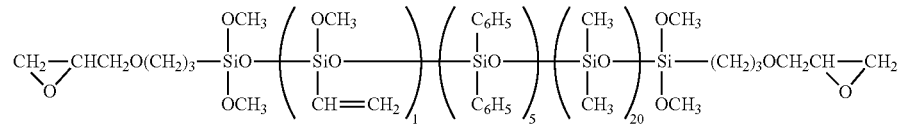

These tackifiers (F) may be used singly or in combination of two or more.

When the tackifier is formulated, its amount is preferably at 0.001 to 10 parts by weight, more preferably at 0.001 to 5 parts by weight, relative to 100 parts by weight of the components (A) to (C) in total.

It is to be noted that in the present invention, the total equivalent of the hydrosilyl group in the silicone resin composition relative to the total equivalent of the alkenyl group in the silicone resin composition is preferably at 0.5 to 2.0, more preferably at 0.7 to 1.8 and much more preferably at 0.8 to 1.4. If it is less than the lower limit, there may be some cases where crosslinkage becomes insufficient. Over the upper limit, unreacted hydrosilyl groups may be left in some cases.

(G) Inorganic Filler

The silicone resin composition of the present invention may be further formulated with (G) an inorganic filler for the purposes of imparting to a cured product an impact resistance, a reinforcing effect, an LED light diffusion effect, an effect of preventing a phosphor from being settled down or an effect of reducing a coefficient of expansion. The inorganic filler is not specifically limited so far as it has such an effect as indicated above. For instance, there can be used reinforcing inorganic fillers such as fumed silica or fumed titanium dioxide and non-reinforcing inorganic fillers such as calcium carbonate, calcium silicate, titanium dioxide, ferric oxide, carbon black or zinc oxide.

If formulated, the inorganic filler is used in an amount of 0.01 to 300 parts by weight, preferably 0.01 to 50 parts by weight, per 100 parts by weight of the total of the components (A) to (C).

Other Components

The silicone resin composition of the present invention may be further formulated with components other than those set out above within ranges not impeding the effect of the present invention.

Silicone Resin Composition

The silicone resin composition of the present invention is prepared by agitating, dissolving, mixing and dispersing the above-described components simultaneously or separately, if necessary, while heating. In general, the respective components are stored after division into two parts in the form of a solution so as not to allow the curing reaction to proceed prior to use, and curing is carried out by mixing the two parts in use. On this occasion, if the organohydrogenpolysiloxane of the component (C) and the addition reaction catalyst of the component (D) are stored together, there is a danger of causing dehydrogenation reaction, so that the components (C) and (D) should favorably be stored separately. If a curing inhibitor such as acetylene alcohol is added in small amounts, storage as one-part solution is possible.

The operations such as of agitation may be effected by use of known apparatus and may not be limited to any specific one. For instance, use can be made of a Raikai mixer, a three roll mill, a ball mill, and a planetary mixer, each equipped with an agitator and a heating device. The apparatuses may be used in appropriate combination.

When measured at 25° C. by means of a rotary viscometer according to the method described in JIS K 7117-1:1999, the viscosity of the silicone resin composition of the present invention is preferably at 100 to 10,000,000 mPa·s, more preferably at 300 to 500,000 mPa·s.

The curing conditions of the silicone resin composition are not critical and the composition can be generally cured at 40 to 250° C., preferably at 60 to 200° C., for 5 minutes to 10 hours, preferably for 30 minutes to 6 hours.

The resulting cured product of the silicone resin composition has high transparency and is adhered very well to a package material such a liquid crystal polymer (LCP) or a metal substrate. Accordingly, the cured product is useful as a sealing or encapsulating material for optical semiconductor elements such as LED, a photodiode, charge coupled device (CCD), complementary metal oxide semiconductor (CMOS) or a photocoupler and is especially favorably used for sealing high-luminance LED.

Where the silicone resin composition of the present invention is used to seal a silver-plated lead frame, it is preferred to preliminarily subject the lead frame to surface treatment so as to enhance the wettability of the silicone resin composition. In view of the workability and device maintenance, the surface treatment is preferably effected according to a dry method, such as ultraviolet (UV) treatment, ozone treatment, and plasma treatment of which plasma treatment is preferred.

In the semiconductor device, a pre-molded package material sealed with a cured product of the silicone resin composition of the present invention is preferably such that the content of s silicone component in the pre-molded package is not less than 15 weight % of a total organic component so as to enhance compatibility with the silicone resin composition. The silicone component is defined as a compound having an Si unit and a polymer thereof. If the silicone component is less than 15 weight % of the total organic component, compatibility with the silicone resin composition may be lowered, so that when sealed with the resin, voids (cavitations) may be formed between the silicone resin composition and the inner walls of the pre-molded package, whereby an optical semiconductor device that is liable to suffer cracks may be formed.

The cured product of the silicone resin composition of the present invention is excellent in resistance to light and heat and thus, no crack or peeling off takes place when the cured product is exposed to high intensity light or high temperature conditions. The sealing of an optical semiconductor element such as a high-luminance LED with the cured product enables the provision of an optical semiconductor device that has a high heat resistance, high light resistance and excellent discoloration and impact resistances and is thus highly reliable.

EXAMPLES

Synthetic Examples, Examples and Comparative Examples are shown to illustrate the present invention, which should not be construed as limited thereto.

(A-1) Synthesis of Resin-Structured Organopolysiloxane

Synthetic Example 1

To a flask, 1,000 g of xylene and 5,014 g of water were added, in which a mixture of 2,285 g (10.8 mols) of phenyltrichlorosilane, 326 g (2.70 mols) of vinyldimethylchlorosilane and 1,478 g of xylene was dropped. After completion of the dropping, agitation was continued for 3 hours, followed by separation of the resulting waste acid and washing with water. After azeotropic dehydration, 6 g of KOH (0.15 mols) was added, followed by refluxing under heating at 150° C. for 8 hours. After neutralization with 27 g (0.25 mols) of trimethylchlorosilane and 24.5 g (0.25 mols) of potassium acetate and filtration, the solvent was distilled off under reduced pressure to prepare siloxane resin (A-1)-1 represented by the following average formula. The resin had a vinyl group equivalent of 0.131 mols/100 g and the vinyl group was found to be at 57.0 mol % in the total substituent groups bonded to the silicon atoms.

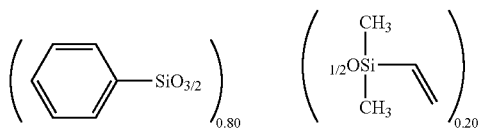

Synthetic Example 2

To a flask, 1,050 g of xylene and 5,143 g of water were added in which a mixture of 2.222 g (10.5 mols) of phenyltrichlorosilane, 543 g (4.50 mols) of vinyldimethylchlorosilane and 1,575 g of xylene was dropped. After completion of the dropping, agitation was continued for 3 hours, followed by separation of the resulting waste acid and washing with water. After azeotropic dehydration, 6 g of KOH (0.15 mols) was added, followed by refluxing under heating at 150° C. for 8 hours. After neutralization with 27 g (0.25 mols) of trimethylchlorosilane and 24.5 g (0.25 mols) of potassium acetate and filtration, the solvent was distilled off under reduced pressure to prepare siloxane resin (A-1)-2 represented by the following average formula. The resin had a vinyl group equivalent of 0.195 mols/100 g and the vinyl group was found to be at 43.75 mol % in the total substituent groups bonded to the silicon atoms.

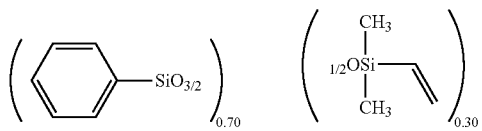

(C) Synthesis of Linear Organohydrogenpolysiloxane

Synthetic Example 3

Into a flask, 5,376 g (22.0 mols) of diphenyldimethoxysilane and 151.8 g of acetonitrile were charged and cooled down to 10° C. or below, and the following drop reaction was carried out at an inner temperature of 10° C. or below. Concentrated sulfuric acid 303.69 g was dropped and 940.36 g of water was subsequently dropped in one hour, followed by further dropping of 2,216 g (16.5 mols) of 1,1,3,3-tetramethyldisiloxane. After completion of the dropping, agitation was continued for 10 hours at 25° C. or below. The resulting waste acid was separated, followed by washing with water and distilling off under reduced pressure to prepare linear organohydrogenpolysiloxane (C)-1 having the following structure. The amount of generated hydrogen was found to be at 90.32 ml/g (i.e. an SiH group equivalent of 0.403 mols/100 g). When measured according to gas chromatography (GC), the amount of the one-end hydrogen polysiloxane in the linear organohydrogenpolysiloxane in the following formula was at 5.5 weight %, and the amount of the both-end hydrogen polysiloxane was at 94.5 weight %. The GC chart is shown in FIG. 1

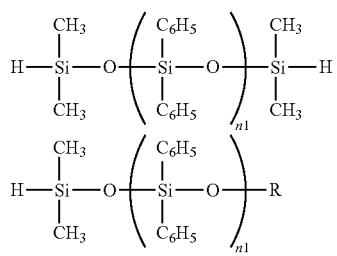

wherein R represents a hydrogen atom or a methyl group, and n1 is 2.0 (an average value).

It will be noted that the measurement with gas chromatography was carried out using the following apparatus and measuring conditions.

Apparatus: GC-2014, manufactured by Shimadzu Corporation

Measuring conditions:

carrier gas was helium; injection amount 20 μl;

initial column temperature 50° C.; detector temperature 300° C.; heating rate 5° C./minute;

and retention time 60 minutes.

Examples 1 to 7 and Comparative Examples 1 and 2

The respective components prepared in Synthetic Examples 1 to 3, and the components indicated below were mixed to provide formulations indicated in Table 1 thereby preparing silicone resin compositions. The viscosity of the respective compositions at 25° C. was measured by means of a rotary viscometer according to the method described in JIS K 7117-1 and shown in Table 1.

(A-2) Linear Organopolysiloxanes Having an Alkenyl Group Only at Both Ends of the Molecular Chain (A-2)-1: Linear organopolysiloxane (with a vinyl group equivalent of 0.0185 mols/100 g, a molecular weight of 11,000 and a viscosity at 25° C. of 4,000 mPa·s) represented by the following formula

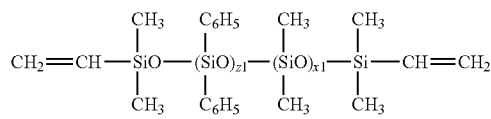

wherein z1 is 30 and x1 is 68.

(A-2)-2: Linear organopolysiloxane (with a vinyl group equivalent of 0.069 mols/100 g, a molecular weight of 2,882 and a viscosity at 25° C. of 1,000 mPa·s) represented by the following formula

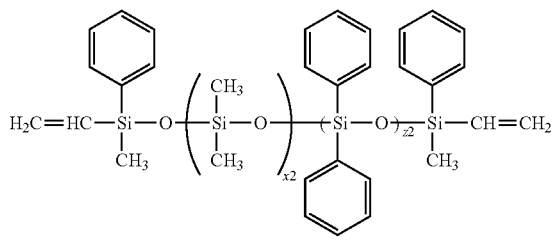

wherein x2 is 10 and z2 is 8.

(B) Organosiloxane Oligomer Having at Least Two Alkenyl Groups in One Molecule (B)-1: Disiloxane represented by the following formula

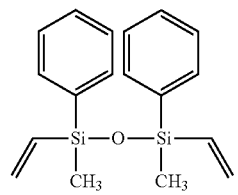 [SMILES: C=C[Si](C)(O[Si](C)(C=C)c1ccccc1)c1ccccc1]

(B)-2: Trisiloxane represented by the following formula

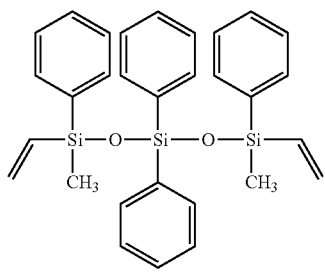 [SMILES: C=C[Si](C)(O[Si](O[Si](C)(C=C)c1ccccc1)(c1ccccc1)c1ccccc1)c1ccccc1]

(C) Organohydrogenpolysiloxane
(C)-2: Branched organohydrogenpolysiloxane (with an amount of generated hydrogen gas of 170.24 ml/g and an SiH group equivalent of 0.76 mols/100 g) represented by the following formula

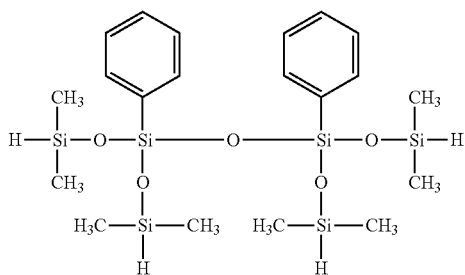 [SMILES: C[SiH](C)O[Si](O[SiH](C)C)(O[Si](O[SiH](C)C)(O[SiH](C)C)c1ccccc1)c1ccccc1]

(C)-3: Linear organohydrogenpolysiloxane (with an amount of generated hydrogen gas of 92.16 ml/g and SiH group equivalent of 0.411 mols/100 g) represented by the following formula

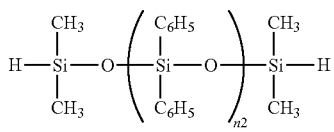

wherein n2 is 2.0 (on average).
(D) Addition reaction catalyst: octyl alcohol-modified solution of chloroplatinic acid (with a platinum concentration of 2 weight %)
(E) Acrylate group-containing compound: dioxane glycol diacrylate (KAYARAD R-604, made by Nippon Kayaku Co., Ltd.)
(F) Tackifier: polysiloxane represented by the following formula

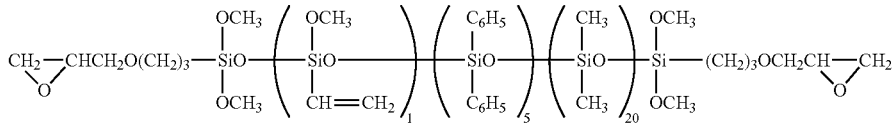

The silicone resin compositions of Examples 1 to 7 and Comparative Examples 1 and 2 were subjected to hot forming (length×width×depth=110 mm×120 mm×2 mm) under conditions of 150° C./4 hours to obtain cured products, followed by visual observation of their appearance. According to JIS K 6253, hardness (measured with a D-type spring tester), tensile strength and elongation at break were measured. Moreover, a water vapor transmission rate was measured according to the Lyssy method (apparatus: L80-5000, made by Systech Instruments Ltd.) described in JIS K 7129. The results are shown in Table 1.

Adhesion Force

The respective silicone resin compositions of Examples 1 to 7 and Comparative Examples 1 and 2 were thinly applied onto a silver-plated copper sheet, on which five silicon chips with one side of 5 mm were placed for every one sample, followed by curing at 60° C. for 1 hour and further at 150° C. for 4 hours to obtain a adhesion test piece. The thus obtained adhesion test piece was subjected to measurement of an adhesion force at break by use of a die bond tester (device: Dage Series 4000 Bondtester, test speed: 200 μm/second, test height: 10.0 μm, measuring temperature: 25° C.), followed by microscopic observation of the break mode. The results are shown in Table 1.

Fabrication of Optical Semiconductor Device

A cup-shaped premold package (with a size of 3 mm×3 mm×1 mm and an opening diameter of 2.6 mm) for LED provided with a copper lead frame having a 2 μm thick silver plating at the bottom thereof was subjected to Ar plasma treatment under reduced pressure (output power: 100 W, irradiation time: 10 seconds), followed by connecting an electrode of an InGaN blue light emission element to the bottom face of the lead frame by means of a silicone paste (insulating adhesive). A counter electrode for the emission element was connected to a counter lead frame with a gold wire. Thereafter, the respective silicone compositions of Examples 1 to 7 and Comparative Examples 1 and 2 were filled into the package opening and the filling workability was evaluated. After the filling, the composition was cured for sealing at 60° C. for 1 hour and further at 150° C. for 4 hours to provide an optical semiconductor device.

The optical semiconductor device was allowed to stand in a constant temperature and humidity chamber of 60° C./90% for 16 hours and soldered to a test mounting board. The reflow temperature was at 260° C.

1) The state of the portions sealed with the silicone resin composition was visually observed after the reflow. One that suffered cracks and underwent peeling off was taken as a defect, and the number of the defects was counted for evaluation.
2) While passing an electric current of 25 mA for lighting, the fabricated optical semiconductor devices were each allowed to stand at 40° C. in an atmosphere of hydrogen sulfide for 1,000 hours, after which the degree of discoloration in the vicinity of the silver-plated surface in the package was visually observed.
3) Using the fabricated optical semiconductor devices, a temperature cycle test and a high temperature and high humidity lighting test were carried out to visually observe the presence or absence of cracks and peeling-off at the package interface and the degree of discoloration in the vicinity of the silver-plated surface in the package. The temperature cycle test was carried out in such a way that the device was exposed to alternate environments of −40° C.×10 minutes and 100° C.×10 minutes over 500 cycles and 1,000 cycles, and the high temperature and high humidity lighting test was carried out in such a way that a 1,000-hours continuous lighting test was performed under conditions of 85° C./85% RH.

These results are shown in Table 1.

cured product was so low in moisture permeability that no discoloration was found in the sulfide test.

In contrast, the silicone resin composition of Comparative Example 1, which is free of the component (B), was low in adhesive durability (humidity resistance), and the optical semiconductor device using a cured product of the composition caused peeling-off and cracks in the temperature cycle test and in the high temperature and high humidity lighting

TABLE 1

| Formulation amount of composition | Example | | | | | | | Comparative Example | |
|---|---|---|---|---|---|---|---|---|---|
| (parts by weight) | 1 | 2 | 3 | 4 | 5 | 6 | 7 | 1 | 2 |
| (A-1)-1 | 79.5 | 79.5 | 79.5 | | 79.5 | 79.5 | 79.5 | 79.5 | |
| (A-1)-2 | | | | 60 | | | | | |
| (A-2)-1 | 18 | 30 | 30 | 10 | | | 18 | 18 | 100 |
| (A-2)-2 | | | | | 10 | | | | |
| (B)-1 | | | 10 | 10 | 10 | 15 | | | 10 |
| (B)-2 | 10 | 10 | | | | | 10 | | |
| (C)-1 | 40.62 | 31.80 | 39.2 | | | 48.9 | 40.62 | | 23.3 |
| (C)-2 | | 3 | 3 | | | | | | |
| (C)-3 | | | | 41.6 | 44.3 | | | 29.1 | |
| (D) | 0.01 | 0.01 | 0.01 | 0.01 | 0.01 | 0.01 | 0.01 | 0.01 | 0.01 |
| (E) | 0.5 | 0.5 | 0.5 | 0.5 | 0.5 | 0.5 | | 0.5 | 0.5 |
| (F) | 3.5 | 3.5 | 3.5 | 3.5 | 3.5 | 3.5 | 3.5 | 3.5 | 3.5 |
| SiH group/SiVi group *1) | 1.06 | 0.98 | 1.00 | 0.90 | 1.00 | 0.95 | 1.10 | 1.05 | 1.05 |
| Amount of phenyl group (mol %) *2) | 47.7 | 45.9 | 44.6 | 39.6 | 47.3 | 47.7 | 47.9 | 42.5 | 31.5 |
| Results of evaluation of composition | | | | | | | | | |
| Viscosity (Pa·s) | 5.3 | 6.2 | 7 | 3 | 8 | 5 | 12 | 50 | 2 |
| Appearance of cured product | colorless, transparent | colorless, transparent | colorless, transparent | colorless, transparent | colorless, transparent | colorless, transparent | colorless, transparent | colorless, transparent | colorless, transparent |
| Hardness (Type D) | 35 | 40 | 38 | 30 | 48 | 34 | 65 | 60 | 15 |
| Tensile strength (MPa) | 3.8 | 6 | 6 | 3 | 7 | 3.5 | 10 | 4 | 0.5 |
| Elongation at break (%) | 200 | 180 | 190 | 220 | 210 | 200 | 150 | 50 | 30 |
| Water vapor transmission rate (g/m² · 24 hours) | 7.5 | 7 | 7.2 | 8 | 7 | 8 | 6.5 | 8.5 | 30 |
| Adhesion force (kg/cm²) | 100 | 180 | 190 | 80 | 80 | 90 | 100 | 140 | 10 |
| Filling workability for LED | good | good | good | good | good | good | good | difficult due to high viscosity | good |
| Adhesiveness after hygroscopic reflow | 0/10 | 0/10 | 0/10 | 0/10 | 0/10 | 0/10 | 0/10 | 2/10 | 0/10 |
| Discoloration after sulfide test | no discoloration | no discoloration | no discoloration | no discoloration | no discoloration | no discoloration | no discoloration | no discoloration | discolored as brown |
| Temperature cycle test (−40° C. to 100° C.) 500 cycles | 0/10 | 0/10 | 0/10 | 0/10 | 0/10 | 0/10 | 0/10 | 6/10 | 2/10 |
| 1,000 cycles | 0/10 | 0/10 | 0/10 | 0/10 | 0/10 | 0/10 | 0/10 | 10/10 | 4/10 |
| High temperature and high humidity lighting test (85° C./85% RH, 1,000 hours) | 0/10 | 0/10 | 0/10 | 0/10 | 0/10 | 0/10 | 0/10 | 2/10 | 5/10 |

*1) SiH group/SiVi group means a total equivalent of the hydrosilyl group in the total of the composition relative to a total equivalent of the alkenyl group in the total composition.
*2) The amount of phenyl group means a total mol percent of the phenyl groups in the components (A) to (C) relative to the total substituent groups bonded to the silicon atoms in the components (A) to (C).

As shown in Table 1, the cured products obtained by curing the silicone resin compositions of the present invention, which make use of the component (A-1) and the component (B) in combination and further includes the component (C), exhibit a very strong adhesion force against the silver-plated copper sheet. The optical semiconductor device sealed with the cured product did not cause peeling off and cracks in the temperature cycle test and high temperature and high humidity lighting test. Moreover, the test. With the silicone resin composition of Comparative Example 2, which was free of the component (A-1), discoloration was observed after the sulfide test.

Hence, the silicone resin composition of the present invention is able to provide a cured product that has a very high adhesion force against a substrate and is low in gas permeability and can provide an optical semiconductor that is excellent in heat resistance, light resistance, discoloration resistance and impact resistance and is thus highly reliable.

Especially, the composition is very useful as a sealant of optical semiconductor elements such as high-luminance LEDs.

Japanese Patent Application No. 2014-213706 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A silicone resin composition for sealing an optical semiconductor element, comprising:
   (A)
   (A-1) 20 to less than 100 parts by weight of an organopolysiloxane having a resin structure which contains at least two alkenyl group in one molecule, the alkenyl groups being present at 10 to 70 mol % of total substituent groups bonded to silicon atoms, and
   (A-2) more than 0 up to 80 parts by weight of a linear organopolysiloxane which has an alkenyl group only at both ends of a molecular chain and has a viscosity of 10 to 1,000,000 mPa·s at 25° C. when measured by means of a Brookfield rotary viscometer according to a method described in JIS K 7117-1 provided that a total content of the components (A-1) and (A-2) is 100 parts by weight;
   (B) 3 to 20 parts by weight of an organosiloxane oligomer having at least two alkenyl groups in one molecule and 2 to 5 silicon atoms, wherein said organosiloxane oligomer is a compound of formula (2):

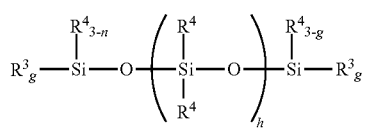

(2)

wherein $R^3$ independently represents an alkenyl group, $R^4$ independently represents an unsubstituted or substituted monovalent aliphatic saturated hydrocarbon group or a monovalent aromatic hydrocarbon group, g is independently an integer of 1 to 3, h is an integer of 0 to 3;
   (C) an organohydrogenpolysiloxane which contains at least one hydrosilyl group and may further contain an alkoxy group or hydroxyl group in one molecule, in an amount corresponding to 0.5 to 4.0 equivalents as a total equivalent of the hydrosilyl groups in the component (C) per unit equivalent of the total alkenyl group in the components (A-1), (A-2), and (B); and
   (D) a catalytic amount of an addition reaction catalyst.

2. The silicone resin composition of claim 1, further comprising 0.1 to 3.0 parts by weight of (E) an acrylate group-containing compound per 100 parts by weight of a total of the components (A) to (C).

3. The silicone resin composition of claim 2, wherein component (E) is at least one member selected from the group consisting of 1,4-butanediol diacrylate, 1,6-hexanediol diacrylate, 1,9-nonanediol diacrylate, tricyclodecene dimethanol acrylate, polyethylene glycol-modified neopentyl glycol diacrylate, tricyclodecane dimethanol diacrylate, bisphenol A (poly)ethoxydiacrylate, bisphenol A (poly) propoxydiacrylate, bisphenol F (poly)ethoxydiacrylate, ethylene glycol di(meth)acrylate, dioxane glycol diacrylate, dicyclopentanyl dimethylene diacrylate, and a diacrylate of an ε-caprolactone adduct of neopentyl glycol (poly)ethylene glycol diacrylate hydroxypivalate.

4. The silicone resin composition of claim 1, wherein the component (A-1) is an organopolysiloxane represented by the following average compositional formula (1):

$$R^1_a R^2_b R^3_c SiO_{(4-a-b-c)/2} \qquad (1)$$

wherein $R^1$ independently represents an unsubstituted or substituted monovalent aliphatic saturated hydrocarbon group, $R^2$ independently represents a monovalent aromatic hydrocarbon group, $R^3$ independently represents an alkenyl group, and a is a positive number of 0.1 to 1.0, b is a positive number of 0 to 0.85 and c is a positive number of 0.05 to 0.5 provided that a+b+c is 1.0 to 1.8.

5. The silicone resin composition of claim 1, wherein the alkenyl group in the component (A-1) is present at 10 to 25 mol % relative to the total substituents bonded to the silicon atoms.

6. The silicone resin composition of claim 1, wherein the component (C) is a linear organohydrogenpolysiloxane represented by the following general formula (3):

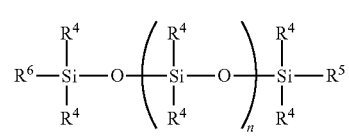

(3)

wherein $R^4$ independently represents an unsubstituted or substituted monovalent aliphatic saturated hydrocarbon group or a monovalent aromatic hydrocarbon group, $R^5$ independently represents a hydrogen atom, a hydroxyl group or an alkoxy group having 1 to 10 carbon atoms, $R^6$ is $R^4$ or $R^5$ wherein at least one atom in the molecule is a hydrogen atom, and n is an integer of 1 to 10.

7. The silicone resin composition of claim 1, wherein the aromatic hydrocarbon group is present at 10 to 60 mol % relative to total substituent groups of the components (A) to (C) bonded to the silicon atoms.

8. The silicone resin composition of claim 1, further comprising as a tackifier, 0.001 to 10 parts by weight of (F) a compound selected from
   alkoxysilanes, chlorosilanes and their (partially) co-hydrolyzed condensates having a group selected from an epoxy group, a (meth)acryl group, an amino group and a mercapto group,
   alkoxysilanes having an alkenyl group or a hydrogen atom (hydrosilyl group),
   alkoxysilyl group-containing isocyanuric acids,
   cyclic siloxanes containing an SiH group, an alkoxysilyl group and/or an epoxy group except for the component (C),
   per 100 parts by weight of a total amount of the components (A) to (C).

9. The silicone resin composition of claim 8, wherein tackifier component (F) is a polysiloxane of the formula

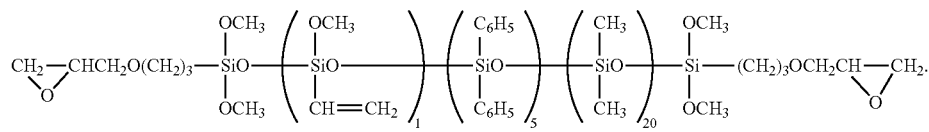

10. The silicone resin composition of claim 1, containing 20 to about 86 parts by weight of component (A-1) and about 14 to 80 parts by weight of component (A-2).

11. The silicone resin composition of claim 1, wherein the organopolysiloxane which has an alkenyl group only at both ends of a molecular chain of component (A-2) is an organopolysiloxane having a linear structure wherein its main chain is composed of repetitions of organodisiloxane units and each end of the molecular chain is blocked with a triorganosiloxy group.

12. The silicone resin composition of claim 11, wherein the organopolysiloxane which has an alkenyl group only at both ends of a molecular chain of component (A-2) is a compound having a structural formula below:

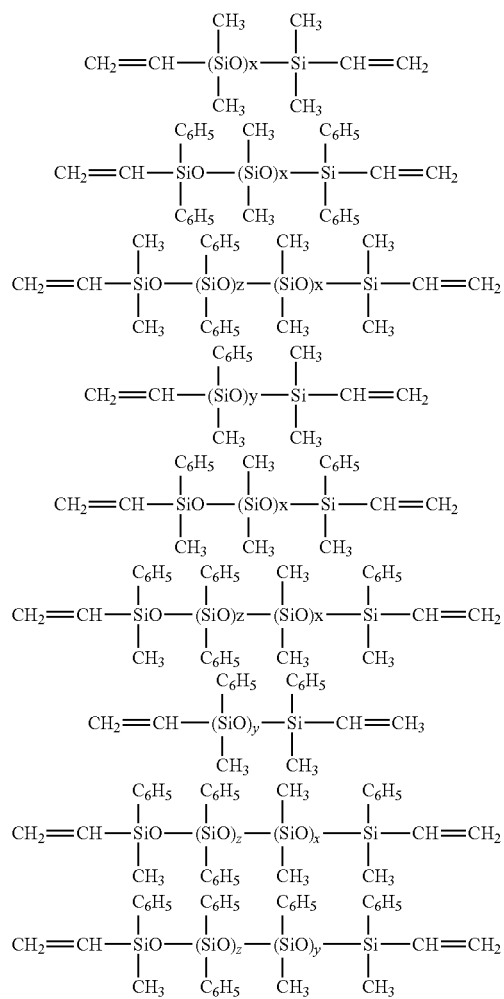

wherein x, y, and z are, respectively, a value of 0 or a positive integer which satisfies the expression 3≤x+y+z≤1,000, wherein x, y, and z are selected to provide a viscosity of 10 to 1,000,000 mPa·s.

13. The silicone resin composition of claim 1, wherein component (D) is a platinum, palladium or rhodium-based catalyst.

14. The silicone resin composition of claim 1, further comprising from 0.01 to 300 parts by weight, per 100 parts by weight of the total of components (A) to (C), of a filler comprising at least one member selected from the group consisting of fumed silica, fumed titanium dioxide, calcium carbonate, calcium silicate, titanium dioxide, ferric oxide, carbon black, and zinc oxide.

15. An optical semiconductor device comprising
an optical semiconductor element sealed with a cured product of a silicone resin composition comprising:
(A)
(A-1) 20 to less than 100 parts by weight of an organopolysiloxane having a resin structure which contains at least two alkenyl group in one molecule, the alkenyl groups being present at 10 to 70 mol % of total substituent groups bonded to silicon atoms, and
(A-2) more than 0 up to 80 parts by weight of a linear organopolysiloxane which has an alkenyl group only at both ends of a molecular chain and has a viscosity of 10 to 1,000,000 mPa·s at 25° C. when measured by means of a Brookfield rotary viscometer according to a method described in JIS K 7117-1
provided that a total content of the components (A-1) and (A-2) is 100 parts by weight;
(B) 3 to 20 parts by weight of an organosiloxane oligomer having at least two alkenyl groups in one molecule and 2 to 5 silicon atoms, wherein said organosiloxane oligomer is a compound of formula (2):

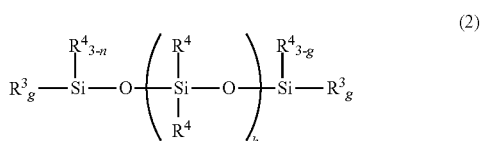

wherein $R^3$ independently represents an alkenyl group, $R^4$ independently represents an unsubstituted or substituted monovalent aliphatic saturated hydrocarbon group or a monovalent aromatic hydrocarbon group, g is independently an integer of 1 to 3, h is an integer of 0 to 3;

(C) an organohydrogenpolysiloxane which contains at least one hydrosilyl group and may further contain an alkoxy group or hydroxyl group in one molecule, in an amount corresponding to 0.5 to 4.0 equivalents as a total equivalent of the hydrosilyl groups in the component (C) per unit equivalent of the total alkenyl group in the components (A-1), (A-2), and (B); and (D) a catalytic amount of an addition reaction catalyst.

* * * * *